United States Patent
Wang et al.

(10) Patent No.: US 9,467,665 B1
(45) Date of Patent: Oct. 11, 2016

(54) COLOR FILTER ARRAY PATTERNS FOR REDUCTION OF COLOR ALIASING

(71) Applicant: OMNIVISION TECHNOLOGIES, INC., Santa Clara, CA (US)

(72) Inventors: Jing Wang, Milpitas, CA (US);
Donghui Wu, Sunnyvale, CA (US);
Jizhang Shan, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/753,643

(22) Filed: Jun. 29, 2015

(51) Int. Cl.
*H04N 9/04* (2006.01)
*H04N 5/378* (2011.01)
*G02B 5/20* (2006.01)

(52) U.S. Cl.
CPC ............. *H04N 9/045* (2013.01); *G02B 5/201* (2013.01); *H04N 5/378* (2013.01)

(58) Field of Classification Search
CPC ................ H04N 9/045; H04N 5/378; H04N 2209/045; H04N 2209/047; G02B 5/201; H01L 27/14621
See application file for complete search history.

(56) References Cited

U.S. PATENT DOCUMENTS 9,219,894 B2* 12/2015 Hayashi ................. H04N 9/045

2015/0109491 A1* 4/2015 Hayashi ................. H04N 9/045
348/273
2015/0116554 A1* 4/2015 Tanaka ..................... H04N 9/07
348/277
2015/0356710 A1* 12/2015 Kunze .................... G06T 3/4015
348/91

OTHER PUBLICATIONS

EP 16173689.7—EPO Partial Search Report, mailed Aug. 1, 2016, 7 pages.
"All Solid State Color Camera With Single-Chip Mos Imager" Hiroaki Nabeyama et al., pp. 40-46, Feb. 1, 1981.

\* cited by examiner

*Primary Examiner* — Nicholas Giles
(74) *Attorney, Agent, or Firm* — Blakely Sokoloff Taylor & Zafman LLP

(57) ABSTRACT

Embodiments are disclosed of a color filter array including a plurality of tiled minimal repeating units. Each minimal repeating unit comprises a set of individual filters grouped into an array of M rows by N columns, wherein each set of individual filters includes a plurality of individual filters having at least first, second, third, and fourth spectral photoresponses. If M equals N, at least two directions within each minimal repeating unit include individual filters having all the spectral photoresponses, the at least two directions being selected from a set of directions consisting of row, column, major diagonal and minor diagonal. And if M≠N at least two directions within each of one or more N×N or M×M cells within the minimal repeating unit include individual filters having all the spectral photoresponses, the at least two directions being selected from a set of directions consisting of row, column, major diagonal and minor diagonal of each cell.

24 Claims, 12 Drawing Sheets

400

| S3 | S4 | S2 | S1 |
|----|----|----|----|
| S2 | S1 | S3 | S4 |
| S4 | S3 | S1 | S2 |
| S1 | S2 | S4 | S3 |

| B | X | G | R |
|---|---|---|---|
| G | R | B | X |
| X | B | R | G |
| R | G | X | B |

| C | X | Y | M |
|---|---|---|---|
| Y | M | C | X |
| X | C | M | Y |
| M | Y | X | C |

| S2 | S1 | S2 | S1 |
|----|----|----|----|
| S4 | S3 | S4 | S3 |
| S1 | S2 | S1 | S2 |
| S3 | S4 | S3 | S4 |

| G | R | G | R |
|---|---|---|---|
| X | B | X | B |
| R | G | R | G |
| B | X | B | X |

| Y | M | Y | M |
|---|---|---|---|
| X | C | X | C |
| M | Y | M | Y |
| C | X | C | X |

| S3 | S2 | S2 | S1 | S4 |
|----|----|----|----|----|
| S2 | S1 | S4 | S3 | S2 |
| S4 | S3 | S2 | S2 | S1 |
| S2 | S2 | S1 | S4 | S3 |
| S1 | S4 | S3 | S2 | S2 |

| B | G | G | R | X |
|---|---|---|---|---|
| G | R | X | B | G |
| X | B | G | G | R |
| G | G | R | X | B |
| R | X | B | G | G |

| C | Y | Y | M | X |
|---|---|---|---|---|
| Y | M | X | C | Y |
| X | C | X | Y | M |
| Y | Y | M | X | C |
| M | X | C | Y | Y |

| G | R | G | R | X | B | X | B |
|---|---|---|---|---|---|---|---|
| X | B | X | B | R | G | R | G |
| R | G | R | G | B | X | B | X |
| B | X | B | X | G | R | G | R |

| G | X | R | B |
|---|---|---|---|
| R | B | G | X |
| G | X | R | B |
| R | B | G | X |
| B | G | X | R |
| X | R | B | G |
| B | G | X | R |
| X | R | B | G |

COLOR FILTER ARRAY PATTERNS FOR REDUCTION OF COLOR ALIASING

TECHNICAL FIELD

The disclosed embodiments relate generally to image sensors and in particular, but not exclusively, to color filter array patterns used with image sensors to minimize color aliasing.

BACKGROUND

Image sensors are widely used in digital still cameras, cellular phones, and security cameras, as well as in medical, automobile, and other applications. The technology used to manufacture image sensors, and especially complementary metal-oxide-semiconductor ("CMOS") image sensors, has continued to advance at great pace, and the demands of higher resolution and lower power consumption have encouraged further miniaturization and integration of image sensors.

Conventional CMOS image sensors use color filter arrays (CFAs) with a set of primary colors such as red, green, and blue (RGB) arranged in what is known as a Bayer pattern. In some embodiments clear pixels, also known as colorless, clear, or panchromatic pixels, can be included in the color filter array to increase the sensitivity of the image sensor. A color filter array that includes clear filters in addition to RGB color filters can be referred to as an RGBC pixel pattern.

Some RGBC patterns increase sensitivity but can suffer from color aliasing. Color aliasing results in the wrong color appearing in an area of the image. For instance, a color such as red or blue can appear in a part of the image that should be green. In another example of color aliasing, a small white line on a black or otherwise dark background that registers on individual pixels will be interpreted as a line containing single pixels of each of the primary colors registered. Color aliasing occurs at least partly due to the alignment of clear filters within an RGBC pattern. Image sensors with clear pixels are more prone to color aliasing because clear pixels do not produce any color information of their own other than the intensity of light.

Color aliasing is a generally undesirable effect caused by using certain color filter array (CFA) patterns with charge-coupled device (CCD) image sensors or CMOS image sensors. It is therefore desirable to design CFA patterns that minimize color aliasing.

BRIEF DESCRIPTION OF THE DRAWINGS

Non-limiting and non-exhaustive embodiments are described with reference to the following figures, wherein like reference numerals refer to like parts throughout the various views unless otherwise specified.

FIGS. 4A-4C are diagrams of embodiments of minimal repeating units.

FIGS. 5A-5C are diagrams of other embodiments of minimal repeating units.

FIGS. 6A-6C are diagrams of other embodiments of minimal repeating units.

FIGS. 7A-7C are diagrams of other embodiments of minimal repeating units.

FIGS. 8A-8C are diagrams of other embodiments of minimal repeating units.

FIGS. 9-10 are diagrams of embodiments of rectangular minimal repeating units.

FIGS. 11A-11B are diagrams of an embodiment of a partial color filter array formed by tiling square minimal repeating units.

DETAILED DESCRIPTION OF THE ILLUSTRATED EMBODIMENTS

Embodiments are described of an apparatus, system and method for color filter array (CFA) patterns to minimize color aliasing, as well as image sensors used with these CFAs. Specific details are described to provide a thorough understanding of the embodiments, but one skilled in the relevant art will recognize that the invention can be practiced without one or more of the described details, or with other methods, components, materials, etc. In some instances well-known structures, materials, or operations are not shown or described in detail but are nonetheless encompassed within the scope of the invention.

Reference throughout this description to "one embodiment" or "an embodiment" means that a described feature, structure, or characteristic can be included in at least one described embodiment. As a result, appearances of "in one embodiment" or "in an embodiment" do not necessarily all refer to the same embodiment. Furthermore, the particular features, structures, or characteristics may be combined in any suitable manner in one or more embodiments.

Figure 1:
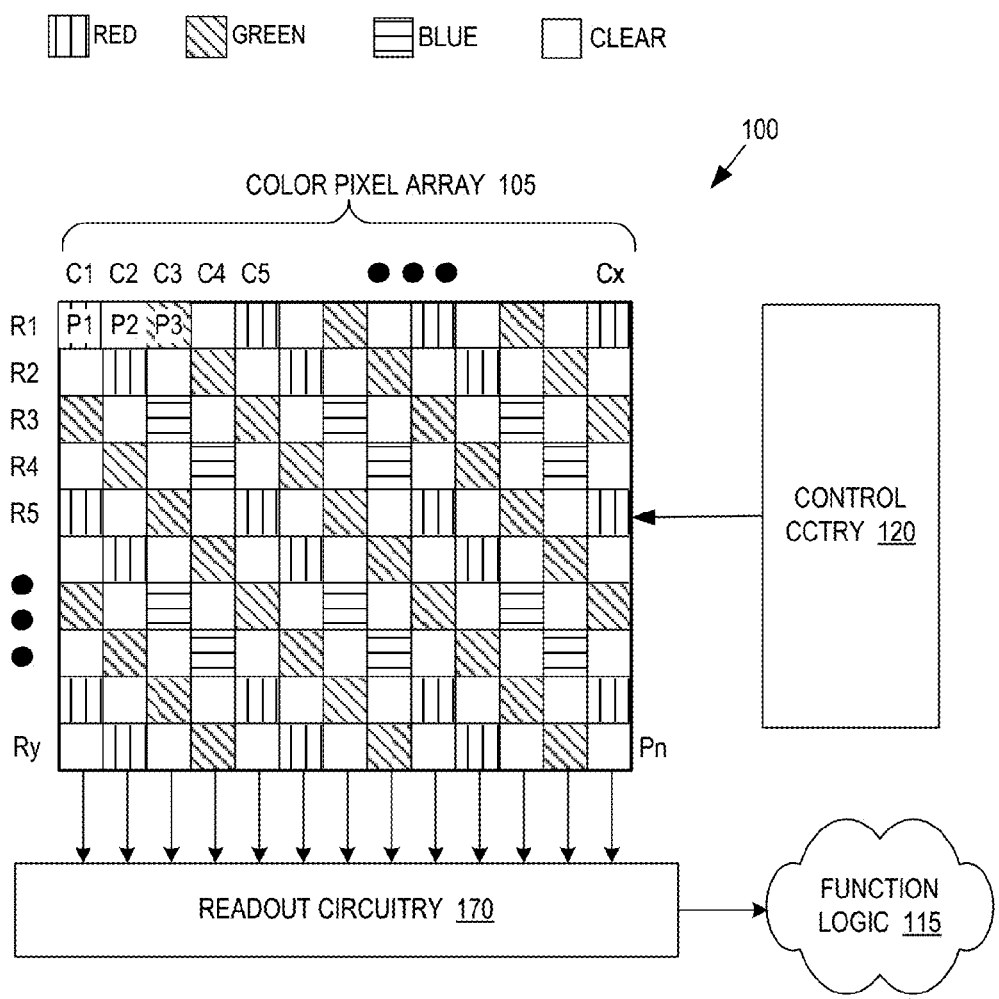
FIG. 1 is a schematic of an embodiment of an image sensor including a color filter array.
Figure 2A:
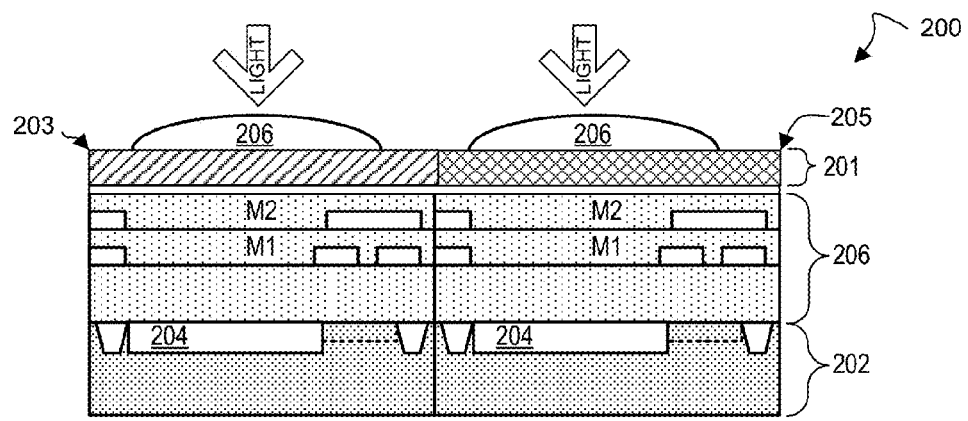
FIGS. 2A-2B are, respectively, cross-sections of embodiments of a pair of frontside-illuminated pixels and embodiments of a pair of backside-illuminated pixels.
Figure 2B:
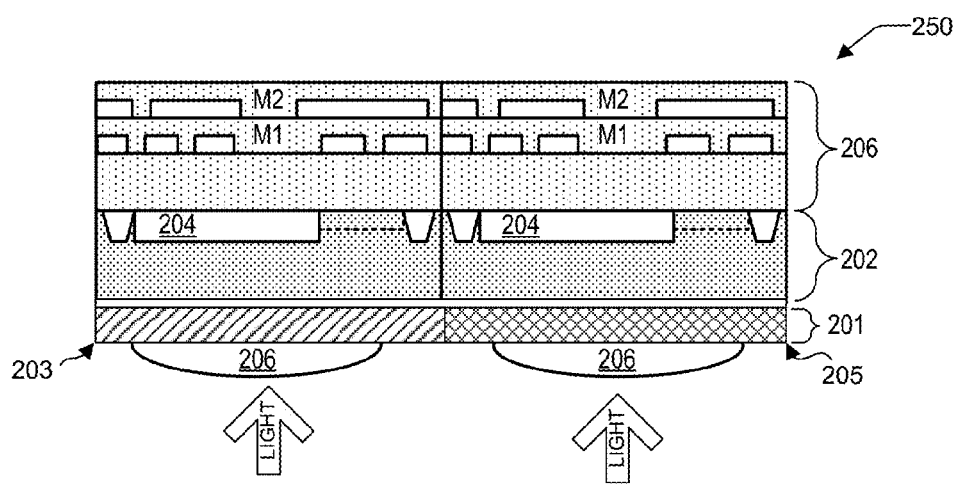

FIG. 1 illustrates an embodiment of a complementary metal oxide semiconductor (CMOS) image sensor 100 including a color pixel array 105, readout circuitry 170 coupled to the pixel array, function logic 115 coupled to the readout circuitry, and control circuitry 120 coupled to the pixel array. Color pixel array 105 is a two-dimensional ("2D") array of individual imaging sensors or pixels (e.g., pixels P1, P2 . . . , Pn) having X pixel columns and Y pixel rows. Color pixel array 105 can be implemented as a frontside-illuminated image sensor, as shown in FIG. 2A, or as a backside-illuminated image sensor, as shown in FIG. 2B. As illustrated, each pixel in the array is arranged into a row (e.g., rows R1 to Ry) and a column (e.g., column C1 to Cx) to acquire image data of a person, place, or object, which can then be used to render a 2D image of the person, place, or object. Color pixel array 105 assigns color to each pixel using a color filter array (CFA) coupled to the pixel array, as further discussed below in connection with the disclosed embodiments of color filter arrays.

After each pixel in pixel array 105 has acquired its image data or image charge, the image data is read out by readout circuitry 170 and transferred to function logic 115 for storage, additional processing, etc. Readout circuitry 170 can include amplification circuitry, analog-to-digital ("ADC") conversion circuitry, or other circuits. Function logic 115 can store the image data and/or manipulate the image data by applying post-image effects (e.g., crop, rotate, remove red eye, adjust brightness, adjust contrast, or otherwise). Function logic 115 can also be used in one embodiment to process the image data to correct (i.e., reduce or remove) fixed pattern noise. Control circuitry 120 is coupled to pixel array 105 to control operational characteristic of color pixel array 105. For example, control circuitry 120 can generate a shutter signal for controlling image acquisition.

FIG. 2A illustrates a cross-section of an embodiment of a pair of frontside-illuminated (FSI) pixels 200 in a CMOS image sensor. The front side of FSI pixels 200 is the side of substrate 202 upon which the photosensitive area 204 and associated pixel circuitry are disposed, and over which metal stack 206 for redistributing signals is formed. Metal stack 206 includes metal layers M1 and M2, which are patterned to create an optical passage through which light incident on FSI pixels 200 can reach photosensitive or photodiode ("PD") regions 204. To implement a color image sensor, the front side can include color filter array 201, with each of its individual color filters (only two individual filters 203 and 205 are illustrated in this particular cross section) disposed under a microlens 206 that aids in focusing incident light onto PD region 204. Color filter array 201 can be a color filter array formed with any of the minimal repeating units discussed herein.

FIG. 2B illustrates a cross-section of an embodiment of a pair of backside-illuminated (BSI) pixels 250 in a CMOS image sensor. As in FSI pixels 200, the front side of pixels 250 is the side of substrate 202 upon which the photosensitive regions 204 and associated pixel circuitry are disposed, and over which metal stack 206 is formed for redistributing signals. The backside is the side of substrate 202 opposite the front side. To implement a color image sensor, the backside can include color filter array 201, with each of its individual color filters (individual filters 203 and 205 are illustrated in this particular cross section) disposed under a microlens 206. Color filter array 201 can be a color filter array formed with any of the minimal repeating units discussed herein. Microlenses 206 aid in focusing incident light onto photosensitive regions 204. Backside illumination of pixels 250 means that the metal interconnect lines in metal stack 206 do not obscure the path between the object being imaged and the photosensitive regions 204, resulting in greater signal generation by photosensitive regions 204.

Figure 3A:
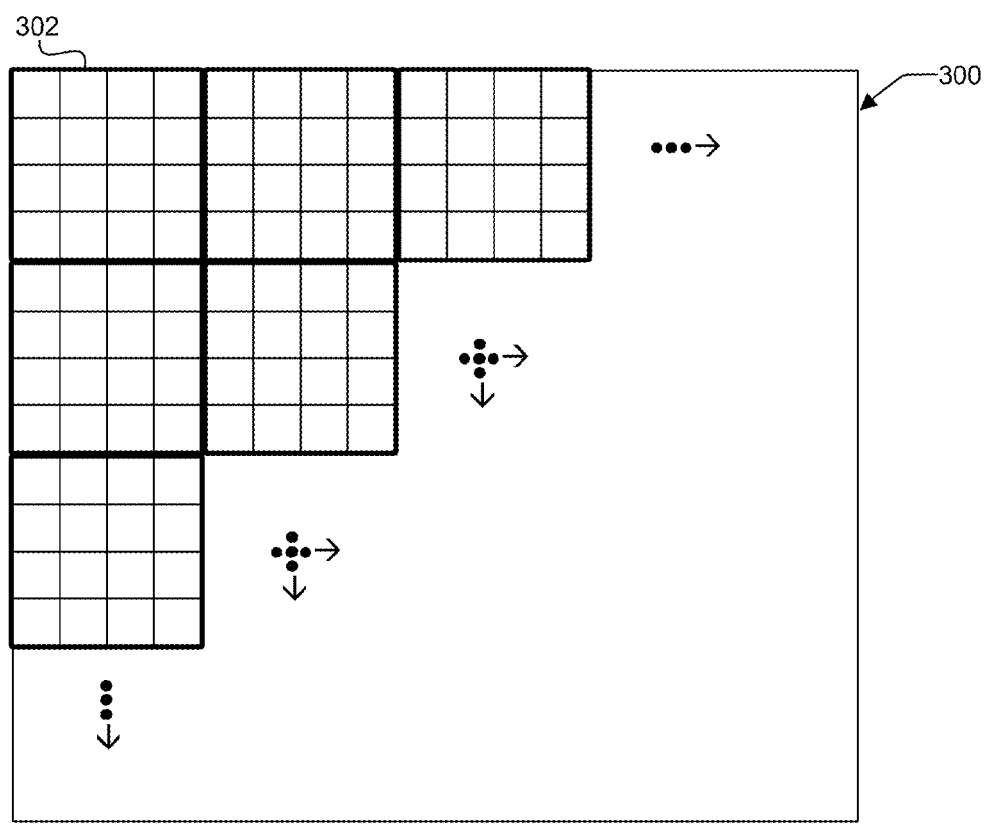
FIG. 3A is a diagram of an embodiment of a color filter array (CFA) formed by tiling multiple minimal repeating units (MRUs).

FIG. 3A illustrates a color filter array (CFA) 300 and a set of minimal repeating units (MRUs) that are tiled to form the CFA. CFA 300 includes a number of individual filters that substantially corresponds to the number of individual pixels in the pixel array to which the CFA is or will be coupled. Each individual filter is optically coupled to a corresponding individual pixel in the pixel array and has a particular spectral photoresponse selected from a set of spectral photoresponses. A particular spectral photoresponse has high sensitivity to certain portions of the electromagnetic spectrum but low sensitivity to other portions of the spectrum. The pixels themselves are not colored, but because CFAs assign a separate photoresponse to each pixel by placing a filter over the pixel, it is common to refer to a pixel as a pixel of that particular photoresponse. Hence a pixel can be referred to as a "clear pixel" if it has no filter or is coupled to a clear (i.e., colorless or panchromatic) filter, as a "blue pixel" if it is coupled to a blue filter, as a "green pixel" if it is coupled to a green filter, or as a "red pixel" if it is coupled to a red filter, and so on.

The set of spectral photoresponses selected for use in a CFA usually has at least three different photoresponses, but in some embodiments can include four or more. In an embodiment of CFA 300 with four spectral photoresponses, the set of photoresponses can be red, green, blue, and clear or panchromatic (i.e., neutral or colorless). But in other embodiments CFA 300 can include other photoresponses in addition to, or instead of, those listed. For instance, other embodiments can include cyan (C), magenta (M), and yellow (Y) filters, clear (i.e., colorless) filters, infrared filters, ultraviolet filters, x-ray filters, etc.

As used herein, a white, clear, colorless, or panchromatic photoresponse refers to a spectral photoresponse having a broader spectral sensitivity than the spectral sensitivities of the selected color photoresponses. A panchromatic photosensitivity can have high sensitivity across the entire visible spectrum. The term panchromatic pixel can refer to a pixel having a panchromatic photoresponse. Although panchromatic pixels generally have a broader spectral sensitivity than the color pixels, each panchromatic pixel can have an associated filter. Such filter is either a neutral density filter or a color filter.

The individual filters in CFA 300 are grouped into minimal repeating units (MRUs) such as MRU 302, and MRUs 302 are tiled vertically and horizontally, as indicated by the arrows, to form CFA 300. A minimal repeating unit is a repeating unit such that no other repeating unit has fewer individual filters. A color filter array can include several different repeating units, but a repeating unit is not a minimal repeating unit if there is another repeating unit in the array with fewer individual filters. Other embodiments of CFA 300 can be tiled using an MRU that includes a greater or smaller number of pixels than illustrated for MRU 302.

Figure 3B:
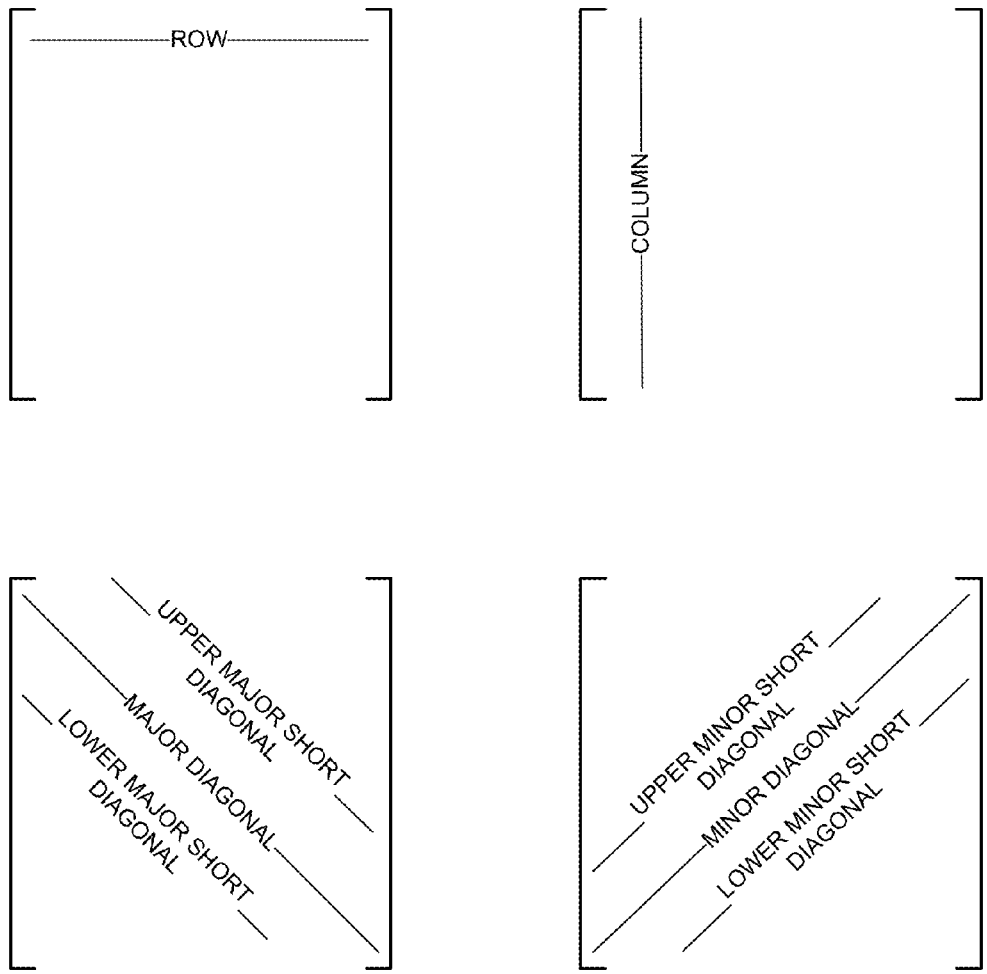
FIG. 3B is a set of diagrams illustrating terminology used to describe minimal repeating units and color filter arrays.

FIG. 3B illustrates terminology that is used below to describe MRUs and the CFAs that result from tiling MRUs. An array is represented in the diagram by a pair of large brackets. Within an array, a row runs from left to right, a column runs from top to bottom, a major diagonal runs from upper left to lower right, whereas a minor diagonal runs from upper right to lower left.

The shorter diagonals that run from top left to bottom right above and below the major diagonal are known as major short diagonals—upper major short diagonals for those above the major diagonal and lower major short diagonals for those below the major diagonal. When the term major short diagonal is used without specifying upper or lower, it applies to both. Although only one upper and one lower major short diagonal is shown in the drawing, and array can have multiple major short diagonals. The terminology used for minor diagonals is analogous, as shown in the figure, and similarly when the term minor short diagonal is used without specifying upper or lower it applies to both. Although only one upper and one lower minor short diagonal are shown in the drawing, and array can have multiple minor short diagonals.

FIGS. 4A-4C illustrate embodiments of minimal repeating units (MRUs). FIG. 4A illustrates an embodiment of an MRU 400 that includes a set of sixteen individual filters arranged in M rows and N columns; in this embodiment, M=N=4, so that MRU 400 is a 4×4 MRU, but in other embodiments M and N can have greater or smaller values (see FIGS. 7A-7C and 8A-8C) and need not have the same value (see, e.g., FIGS. 9-10).

The sixteen individual filters in MRU 400 include four different spectral photoresponses S1-S4 that are arranged in MRU 400 so that at least two directions within the MRU include all four photoresponses—the at least two directions being selected from among the row direction, the column direction, the major diagonal direction, and the minor diagonal direction. In MRU 400, two directions within the MRU include all four spectral photoresponses S1-S4: as shown by the light gray lines in FIG. 4A, in MRU 400 every row and every column include every spectral photoresponse, but the major and minor diagonals do not.

FIG. 4B illustrates an embodiment of an MRU 425 in which the individual filters are arranged as in MRU 400 but have specific assignments of spectral photoresponses S1-S4. In MRU 425 the spectral photoresponses S1-S4 are selected from a primary color set including red (R), green (G), blue (B), and an additional photoresponse (X) that can be an additional color or can be a non-color or non-visible photoresponse such as panchromatic (i.e., clear or colorless), infrared, ultraviolet, or x-ray. In MRU 425, the spectral photoresponses are assigned so that S1 is red, S2 is green, and S3 is blue, and S4 is photoresponse X.

FIG. 4C illustrates an embodiment of an MRU 450 similar to MRU 425, the primary difference being that in MRU 450 spectral photoresponses S1-S3 are selected from a primary color set including cyan (C), magenta (M), and yellow (Y). S4 continues to be photoresponse X, which as before can be an additional color or can be a non-color or nonvisible photoresponse such as panchromatic (i.e., clear or colorless), infrared, ultraviolet, or x-ray.

FIGS. 5A-5C illustrate other embodiments of minimal repeating units. FIG. 5A illustrates an embodiment of an MRU 500 that includes a set of sixteen individual filters arranged in M rows and N columns; in this embodiment, M=N=4, so that MRU 500 is a 4×4 MRU, but in other embodiments M and N can have greater or smaller values and need not have the same value.

The sixteen individual filters in MRU 500 include four different spectral photoresponses S1-S4 that are arranged in MRU 500 so that at least two directions within the MRU include all four photoresponses—the at least two directions being selected from among the row direction, the column direction, the major diagonal direction, and the minor diagonal direction. In MRU 500, three directions within the MRU include all four spectral photoresponses S1-S4: as shown by the light gray lines in FIG. 5A, in MRU 500 every column includes every spectral photoresponse, as do the major and minor diagonals.

FIG. 5B illustrates an embodiment of an MRU 525 in which the individual filters are arranged as in MRU 500 but have specific assignments of spectral photoresponses S1-S4. In MRU 525 the spectral photoresponses S1-S4 are selected from a primary color set including red (R), green (G), blue (B), and an additional photoresponse (X) that can be an additional color or can be a non-color or non-visible photoresponse such as panchromatic (i.e., clear or colorless), infrared, ultraviolet, or x-ray. In MRU 525, the spectral photoresponses are assigned so that S1 is red, S2 is green, and S3 is blue, and S4 is photoresponse X.

FIG. 5C illustrates an embodiment of an MRU 550 similar to MRU 525, the primary difference being that in MRU 550 spectral photoresponses S1-S3 are selected from a primary color set including cyan (C), magenta (M), and yellow (Y). S4 continues to be photoresponse X, which as before can be an additional color or can be a non-color or non-visible photoresponse such as panchromatic (i.e., clear or colorless), infrared, ultraviolet, or x-ray.

Figures 6A, 6B:
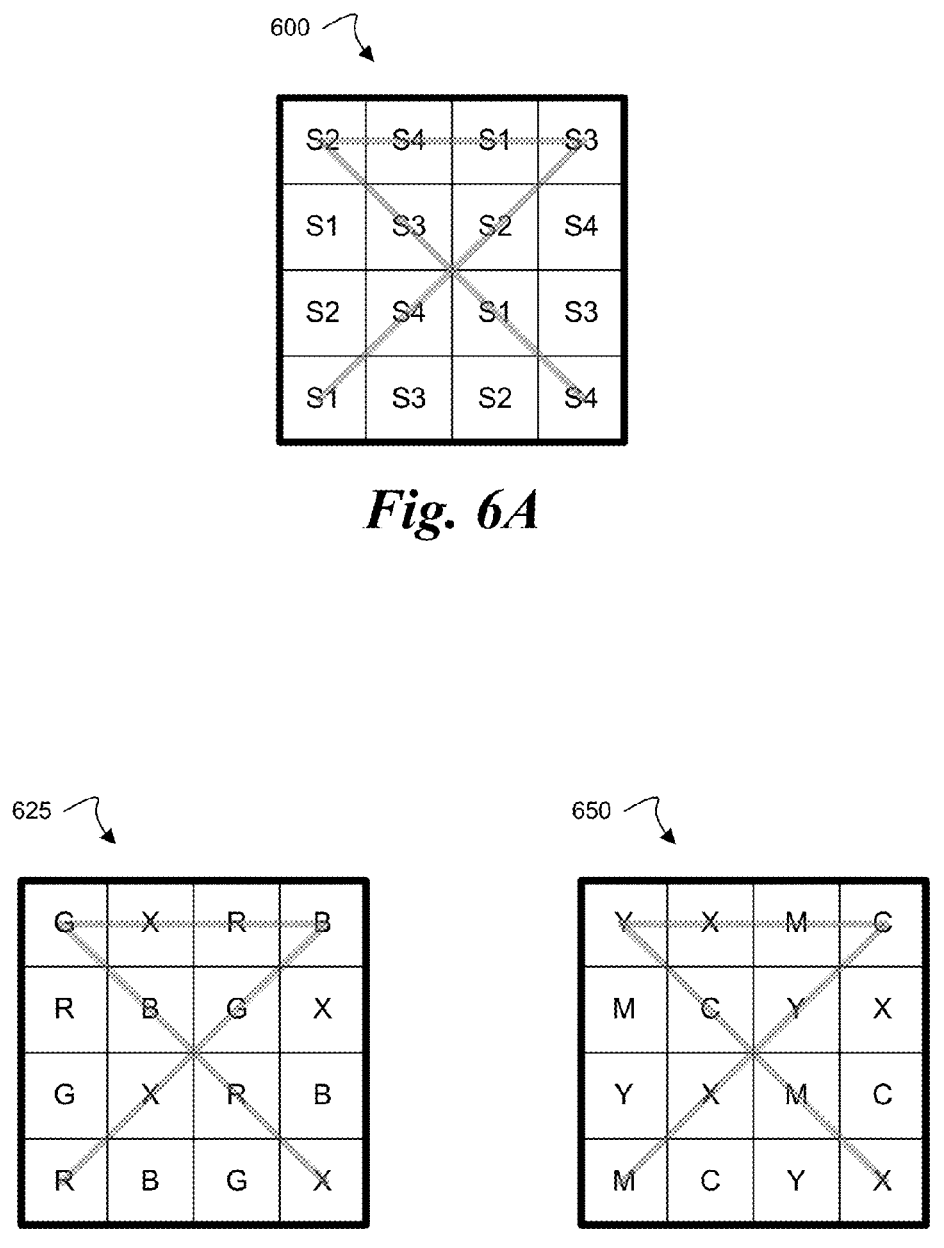

FIGS. 6A-6C illustrate other embodiments of minimal repeating units. FIG. 6A illustrates an embodiment of an MRU 600 that includes a set of sixteen individual filters arranged in M rows and N columns; in this embodiment, M=N=4, so that MRU 500 is a 4×4 MRU, but in other embodiments M and N can have greater or smaller values and need not have the same value.

The sixteen individual filters in MRU 600 include four different spectral photoresponses S1-S4 that are arranged in MRU 600 so that at least two directions within the MRU include all four photoresponses—the at least two directions being selected from among the row direction, the column direction, the major diagonal direction, and the minor diagonal direction. In MRU 600, three directions within the MRU include all four spectral photoresponses S1-S4: as shown by the light gray lines in FIG. 6A, in MRU 600 every row includes every spectral photoresponse, as do the major and minor diagonals.

FIG. 6B illustrates an embodiment of an MRU 625 in which the individual filters are arranged as in MRU 600 but have specific assignments of spectral photoresponses S1-S4. In MRU 625 spectral photoresponses S1-S4 are selected from a primary color set including red (R), green (G), blue (B), and an additional photoresponse (X) that can be an additional color or can be a non-color or non-visible photoresponse such as panchromatic (i.e., clear or colorless), infrared, ultraviolet, or x-ray. In MRU 625, the spectral photoresponses are assigned so that S1 is red, S2 is green, and S3 is blue, and S4 is photoresponse X.

FIG. 6C illustrates an embodiment of an MRU 650 similar to MRU 625, the primary difference being that in MRU 650 spectral photoresponses S1-S3 are selected from a primary color set including cyan (C), magenta (M), and yellow (Y). S4 continues to be photoresponse X, which as before can be an additional color or can be a non-color or non-visible photoresponse such as panchromatic (i.e., clear or colorless), infrared, ultraviolet, or x-ray.

FIGS. 7A-7C illustrate other embodiments of minimal repeating units. FIG. 7A illustrates an embodiment of an MRU 700 that includes a set of twenty-five individual filters arranged in M rows and N columns; in this embodiment, M=N=5, so that MRU 500 is a 5×5 MRU, but in other embodiments M and N can have greater or smaller values and need not have the same value.

The twenty-five individual filters in MRU 700 include four different spectral photoresponses S1-S4 that are arranged in MRU 700 so that at least two directions within the MRU include all four photoresponses at least once—the at least two directions being selected from among the row direction, the column direction, the major diagonal direction, and the minor diagonal direction. Because there are only four spectral photoresponses but five filters per direction, one of the four spectral photoresponses must be repeated in a direction. Hence, in MRU 700, four directions within the MRU include at least one occurrence of every spectral photoresponse S1-S4. As illustrated by the light gray lines in FIG. 7A, in MRU 700 every row and every column includes at least one occurrence of every spectral photoresponse, as do the major and minor diagonals. As a result, the pattern shown in FIG. 7A can be considered a variation of the mathematical construct known as a Latin square.

FIG. 7B illustrates an embodiment of an MRU 725 in which the individual filters are arranged as in MRU 700 but have specific assignments of spectral photoresponses S1-S4. In MRU 725 spectral photoresponses S1-S4 are selected from a primary color set including red (R), green (G), blue (B), and an additional photoresponse (X) that can be an additional color or can be a non-color or non-visible photoresponse or such as panchromatic (i.e., clear or colorless), infrared, ultraviolet, or x-ray. In MRU 725, the spectral photoresponses are assigned so that S1 is red, S2 is green, and S3 is blue, and S4 is photoresponse X.

FIG. 7C illustrates an embodiment of an MRU 750 similar to MRU 725, the primary difference being that in MRU 750 spectral photoresponses S1-S3 are selected from a primary color set including cyan (C), magenta (M), and yellow (Y). S4 continues to be photoresponse X, which as before can be an additional color or can be a non-color or non-visible photoresponse such as panchromatic (i.e., clear or colorless), infrared, ultraviolet, or x-ray.

Figures 8A, 8B:
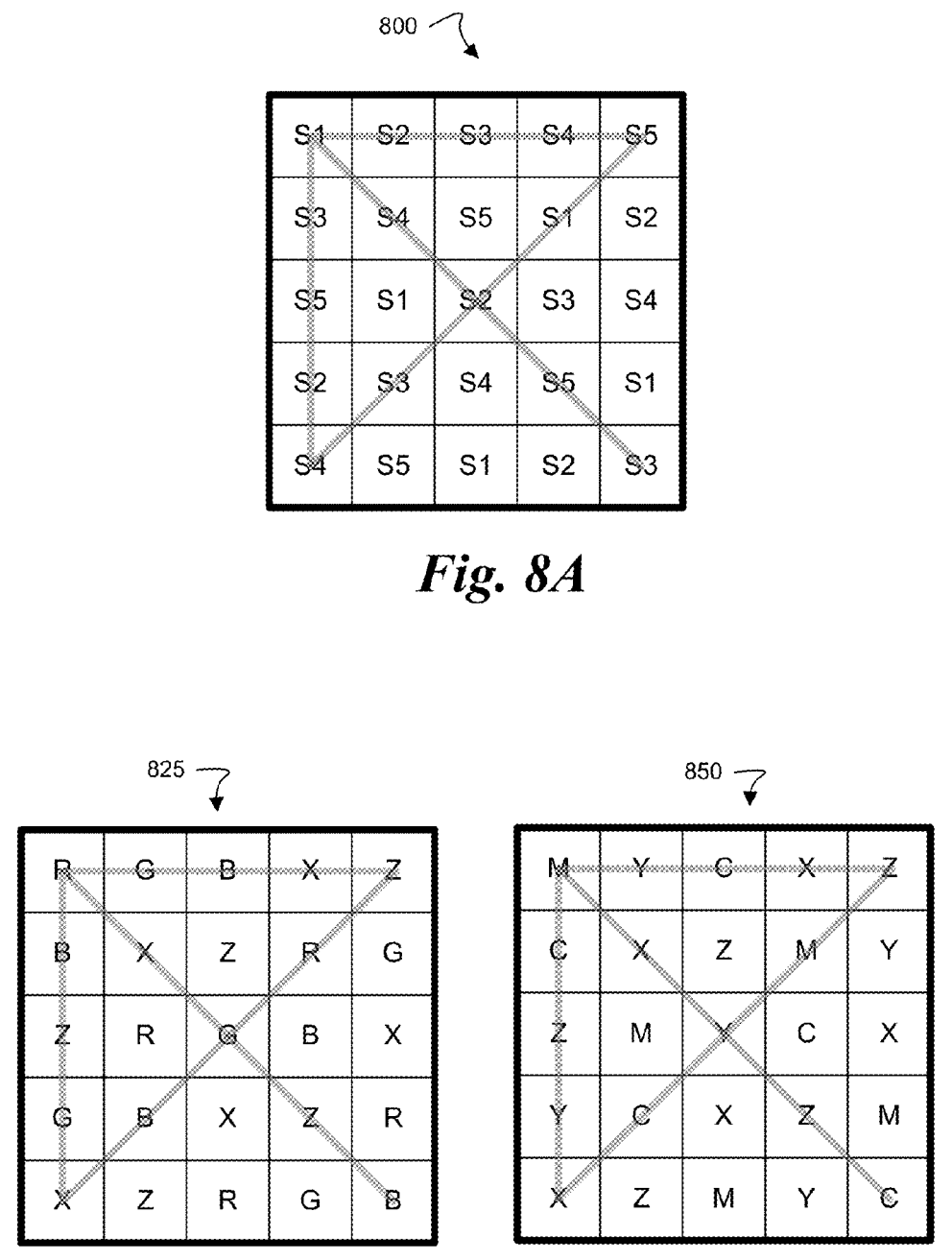

FIGS. 8A-8C illustrate other embodiments of minimal repeating units. FIG. 8A illustrates an embodiment of an MRU 800 that includes a set of twenty-five individual filters arranged in M rows and N columns; in this embodiment, M=N=5, but in other embodiments M and N can have greater or smaller values and need not have the same value (see, e.g., FIGS. 9-10).

The twenty-five individual filters in MRU 900 include five different spectral photoresponses S1-S5 that are arranged in MRU 800 so that at least two directions within the MRU include all five spectral photoresponses—the at least two directions being selected from among the row direction, the column direction, the major diagonal direction, and the minor diagonal direction. Four directions within the MRU include all five spectral photoresponses S1-S5: as illustrated by the light gray lines in FIG. 8A, in MRU 800 every row and every column includes an occurrence of every spectral photoresponse S1-S5, as do the major and minor diagonals. As a result, the pattern shown in FIG. 8A forms a Latin square.

FIG. 8B illustrates an embodiment of an MRU 825 in which the individual filters are arranged as in MRU 800 but have specific assignments of spectral photoresponses S1-S5. In MRU 825 spectral photoresponses S1-S5 are selected from a primary color set including red (R), green (G), blue (B), and additional photoresponses X and Z that can be an additional color or can be a non-color or non-visible photoresponse such as panchromatic (i.e., clear or colorless), infrared, ultraviolet, or x-ray. In MRU 825, the spectral photoresponses are assigned so that S1 is red, S2 is green, and S3 is blue, S4 is spectral photoresponse X, and S5 is spectral photoresponse Z.

FIG. 8C illustrates an embodiment of an MRU 850 similar to MRU 825, the primary difference being that spectral photoresponses S1-S3 are selected from a primary color set including cyan (C), magenta (M), and yellow (Y). S4 continues to be photoresponse X and S5 continues to be spectral photoresponse Z; as before, each of X and Z can be an additional color photoresponse or can be a non-color or non-visible photoresponse such as panchromatic (i.e., clear or colorless), infrared, ultraviolet, or x-ray.

FIG. 9 illustrates an embodiment of a rectangular (non-square) minimal repeating unit 900. MRU 900 includes a set of thirty-two individual filters arranged in M rows and N columns; in this embodiment, M=4 and N=8, but in other embodiments both M and N can have values greater or smaller than shown. MRU 900 includes four spectral photoresponses S1-S4 selected from a primary color set including red (R), green (G), blue (B), and an additional photoresponse X that can be an additional color or can be a non-color or non-visible photoresponse such as panchromatic (i.e., clear or colorless), infrared, ultraviolet, or x-ray. In the illustrated embodiments, the spectral photoresponses are assigned so that S1 is red, S2 is green, S3 is blue, and S4 is spectral photoresponse X. In other embodiments photoresponses can be selected from other primary color sets such as cyan, magenta, and yellow.

In rectangular MRU embodiments where M is an integral multiple of N or vice versa, the MRU can be divided into an integral number of M×M or N×N cells. MRU 900, for instance, can be divided into two 4×4 cells of sixteen filters (i.e., two M×M cells). The sixteen individual filters in each cell include four different spectral photoresponses arranged in the cell so that at least two directions within the cell include all four spectral photoresponses—the at least two directions being selected from among the row direction, the column direction, the major diagonal direction, and the minor diagonal direction. In MRU 900 three directions within each cell of the MRU include all four spectral photoresponses: as illustrated by the light gray lines in FIG. 9, in each cell every column includes an occurrence of every spectral photoresponse, as do the major and minor cell diagonals.

FIG. 10 illustrates an embodiment of a rectangular (non-square) minimal repeating unit (MRU) 1000. MRU 1000 includes a set of thirty-two individual filters arranged in M rows and N columns; in this embodiment, M=8 and N=4, but in other embodiments both M and N can have values greater or smaller than shown. MRU 1000 includes four spectral photoresponses selected from a primary color set including red (R), green (G), blue (B), and an additional photoresponse X that can be an additional color or can be a non-color or non-visible photoresponse such as panchromatic (i.e., clear or colorless), infrared, ultraviolet, or x-ray. In the illustrated embodiments, the spectral photoresponses are assigned so that S1 is red, S2 is green, and S3 is blue, and S4 is spectral photoresponse X. In other embodiments photoresponses can be selected from other primary color sets such as cyan, magenta, and yellow.

In rectangular MRU embodiments where M is an integral multiple of N or vice versa, the MRU can be divided into an integral number of M×M or N×N cells. MRU 1000, for instance, can be divided into two 4×4 cells of sixteen filters (i.e., two N×N cells). The sixteen individual filters in each cell of MRU 1000 include four different spectral photoresponses that are arranged in the cell so that at least two directions within the cell include all four spectral photoresponses—the at least two directions being selected from among the row direction, the column direction, the major diagonal direction, and the minor diagonal direction. In MRU 10000 three directions within each cell of the MRU include all four spectral photoresponses: as illustrated by the light gray lines in FIG. 9, in each cell every row includes an occurrence of every spectral photoresponse, as do the major and minor cell diagonals.

FIG. 11 illustrates an embodiment of a partial color filter array (CFA) 1100. CFA 1100 is described as "partial" because in most practical image sensors a complete CFA would be substantially larger than shown, making it impractical to show a complete CFA in the drawing. Nonetheless, what follows regarding the properties of partial CFA 1100 would also be true of a complete CFA.

Partial CFA 1100 is made up of nine MRUs 525 tiled together (as shown, for instance, in FIG. 3A) in an array of three rows and three columns of MRUs. CFA 1100 illustrates a property of CFAs formed from MRU that have the diagonal property—that is, MRUs in which all the spectral photoresponses are found along a major diagonal, a minor diagonal, or both. A CFA formed by tiling an MRU with all photoresponses along its major diagonal will also have all the spectral photoresponses along its major diagonal, as well as along all major short diagonals that have a number of individual filters at least equal to the number of spectral photoresponses. And the same is true for an MRU with all photoresponses along its minor diagonal: all spectral responses will be found along the CFA's minor diagonal, as well as along any minor short diagonals with a number of individual filters at least equal to the number of spectral photo responses.

Figures 11A, 11B:
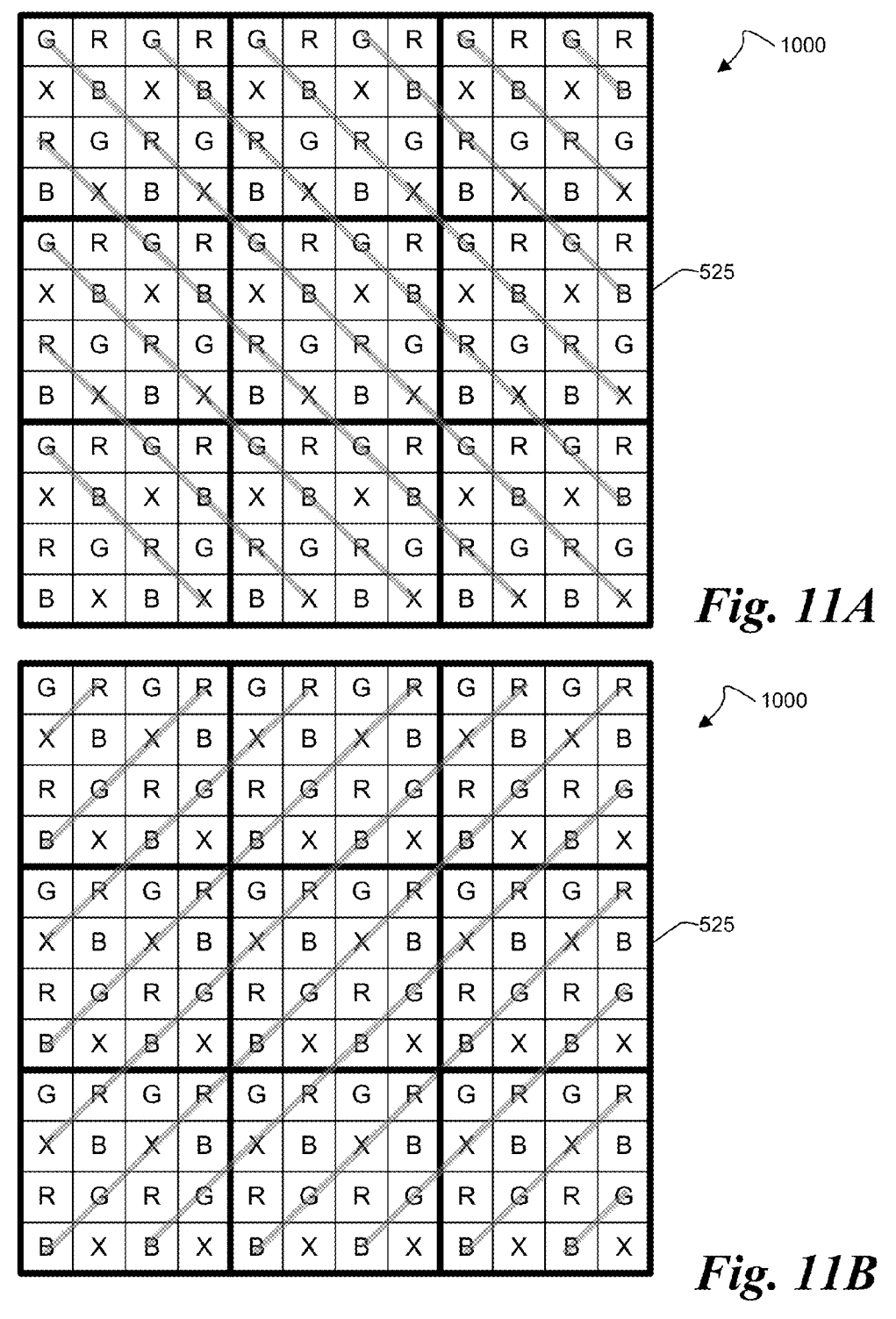

In the illustrated embodiment, CFA 1100 is formed from MRU 525, which has four spectral photoresponses and which has all the photoresponses along both its major and minor diagonals. As shown by the faint gray lines FIG. 11A, the resulting CFA 1100 has all photoresponses on its major diagonal and on all major short diagonals with four or more filters. And, as can be seen in FIG. 11B, CFA 1100 also has all photoresponses on its minor diagonal and on all minor short diagonals with four or more filters.

Figure 12:
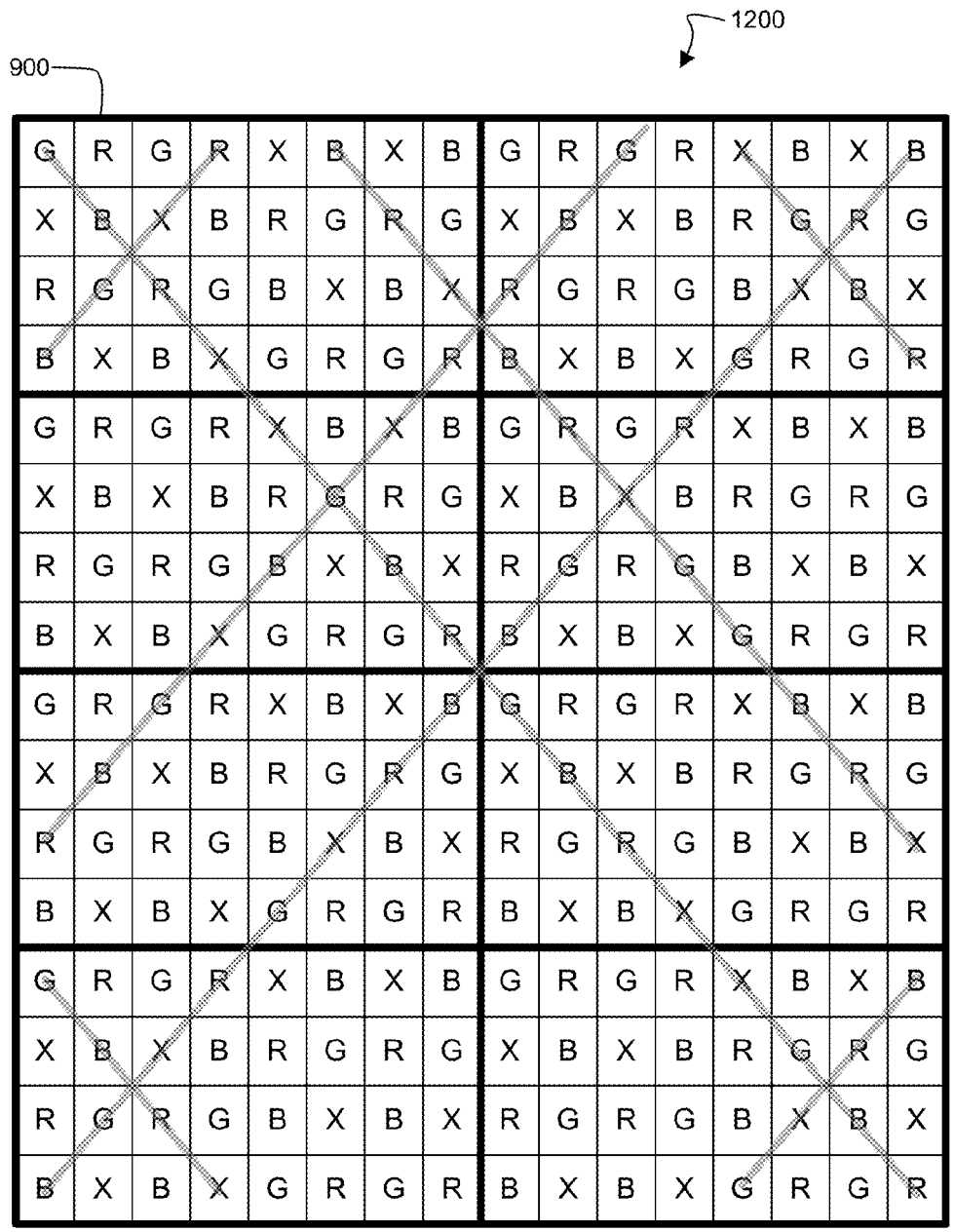
FIG. 12 is a diagram of an embodiment of a partial color filter array formed by tiling a rectangular minimal repeating unit.

FIG. 12 illustrates an embodiment of a partial color filter array (CFA) 1200. CFA 1200 is described as "partial" because in most practical image sensors a complete CFA would be substantially larger than shown, making it impractical to show a complete CFA in the drawing. Nonetheless, what follows regarding the properties of partial CFA 1200 would also be true of a complete CFA.

Partial CFA 1200 is made up of nine rectangular MRUs 900 tiled together (as shown, for instance, in FIG. 3A) in an array of three rows and four columns of MRUs. CFA 1200 illustrates a property of CFAs formed from a rectangular MRU that can be divided into cells that have the diagonal property—that is, MRUs with cells in which all the spectral photoresponses are found along a major diagonal of the cell, a minor diagonal of the cell, or both. A CFA formed by tiling an MRU divided into cells that have all photoresponses along their major diagonals will also have all the spectral photoresponses along its major diagonal, as well as along all major short diagonals that have a number of individual filters at least equal to the number of spectral photoresponses. And this is correspondingly true for an MRU divided into cells that have all photoresponses along their minor diagonal: all spectral responses will be found along the CFA's minor diagonal, as well as along any minor short diagonals with a number of individual filters at least equal to the number of spectral photo responses.

In the illustrated embodiment, CFA 1200 is formed by tiling MRU 900. MRU 900 is a 4×8 rectangular MRU with four photoresponses. The MRU can be divided into two 4×4 cells, each of which has all four spectral photoresponses along both its major and minor diagonals. As shown by the faint gray lines in FIG. 12, CFA 1200 also has all photoresponses on its major diagonal and all major short diagonals with four or more filters. And, as can also be seen in FIG. 12, CFA 1200 also has all photoresponses on its minor diagonal and all minor short diagonals with four or more filters.

The above description of illustrated embodiments of the invention, including what is described in the abstract, is not intended to be exhaustive or to limit the invention to the disclosed forms. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the disclosed embodiments. Rather, the scope of the invention must be determined entirely by the following claims, which must be construed according to established doctrines of claim interpretation.

The invention claimed is:

1. A color filter array comprising:
    a plurality of tiled minimal repeating units, each minimal repeating unit comprising:
    a set of individual filters grouped into an array of M rows by N columns, wherein each set of individual filters includes a plurality of individual filters having at least first, second, third, and fourth spectral photoresponses;
    wherein if M equals N at least two directions within each minimal repeating unit include individual filters having all the spectral photoresponses, the at least two directions being selected from a set of directions consisting of row, column, major diagonal and minor diagonal of the minimal repeating unit; and
    wherein if M does not equal N at least two directions within each of one or more N×N or M×M cells within the minimal repeating unit include individual filters having all the spectral photoresponses, the at least two directions being selected from a set of directions consisting of row, column, major diagonal and minor diagonal of each N×N or M×M cells.

2. The color filter array of claim 1 wherein if M=N and all the photoresponses are found on the major diagonal or the minor diagonal, the resulting color filter array will have all the photoresponses in any diagonal that includes a number of individual filters that is equal to or greater than the number of spectral photoresponses.

3. The color filter array of claim 1 wherein if M≠N and all the photoresponses are found on the major diagonal or the minor diagonal within an N×N or M×M cell, the resulting color filter array will have all the photoresponses in any diagonal that includes a number of individual filters that is equal to or greater than the number of spectral photoresponses.

4. The color filter array of claim 1 wherein M=N=4 and the minimal repeating unit is:

| S3 | S4 | S2 | S1 |
| --- | --- | --- | --- |
| S2 | S1 | S3 | S4 |
| S4 | S3 | S1 | S2 |
| S1 | S2 | S4 | S3 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

5. The color filter array of claim 4 wherein:
    the first, second, and third spectral photoresponses are selected from a group consisting of red (R), green (G), blue (B), cyan (C), magenta (M), and yellow (Y); and
    the fourth spectral photoresponse is selected from a group consisting of panchromatic, infrared, ultraviolet, and x-ray.

6. The color filter array of claim 1 wherein M=N=4 and the minimal repeating unit is:

| S2 | S1 | S2 | S1 |
| --- | --- | --- | --- |
| S4 | S3 | S4 | S3 |
| S1 | S2 | S1 | S2 |
| S3 | S4 | S3 | S4 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

7. The color filter array of claim 1 wherein M=N=4 and the minimal repeating unit is:

| S2 | S4 | S1 | S3 |
|----|----|----|----|
| S1 | S3 | S2 | S4 |
| S2 | S4 | S1 | S3 |
| S1 | S3 | S2 | S4 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

8. The color filter array of claim 1 wherein M=N=5 and the minimal repeating unit is:

| S3 | S2 | S2 | S1 | S4 |
|----|----|----|----|----|
| S2 | S1 | S4 | S3 | S2 |
| S4 | S3 | S2 | S2 | S1 |
| S2 | S2 | S1 | S4 | S3 |
| S1 | S4 | S3 | S2 | S2 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

9. The color filter array of claim 1 wherein M=N=5 and the minimal repeating unit is:

| S1 | S2 | S3 | S4 | S5 |
|----|----|----|----|----|
| S3 | S4 | S5 | S1 | S2 |
| S5 | S1 | S2 | S3 | S4 |
| S2 | S3 | S4 | S5 | S1 |
| S4 | S5 | S1 | S2 | S3 | wherein S1 represents an individual filter with the first spectral photoresponse, S2 represents an individual filter with the second spectral photoresponse, S3 represents an individual filter with the third spectral photoresponse, S4 represents an individual filter with the fourth spectral photoresponse, and S5 represents an individual filter with a fifth spectral photoresponse.

10. The color filter array of claim 9 wherein:
the first, second, and third spectral photoresponses are selected from a group consisting of red (R), green (G), blue (B), cyan (C), magenta (M), and yellow (Y); and
the fourth and fifth spectral photoresponses are selected from a group consisting of panchromatic, infrared, ultraviolet, and x-ray.

11. The color filter array of claim 1 wherein M=4, N=8, and the minimal repeating unit is:

| S2 | S1 | S2 | S1 | S4 | S3 | S4 | S3 |
|----|----|----|----|----|----|----|----|
| S4 | S3 | S4 | S3 | S2 | S1 | S2 | S1 |
| S1 | S2 | S1 | S2 | S3 | S4 | S3 | S4 |
| S3 | S4 | S3 | S4 | S1 | S2 | S1 | S2 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

12. The color filter array of claim 1 wherein M=8, N=4, and the minimal repeating unit is:

| S2 | S4 | S1 | S3 |
|----|----|----|----|
| S1 | S3 | S2 | S4 |
| S2 | S4 | S1 | S3 |
| S1 | S3 | S2 | S4 |
| S4 | S2 | S3 | S1 |
| S3 | S1 | S4 | S2 |
| S4 | S2 | S3 | S1 |
| S3 | S1 | S4 | S2 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

13. An image sensor comprising:
a pixel array including a plurality of individual pixels;
a color filter array positioned over and optically coupled to the pixel array, the color filter array comprising a plurality of tiled minimal repeating units, each minimal repeating unit comprising:
a set of individual filters grouped into an array of M rows by N columns, wherein each set of individual filters includes a plurality of individual filters having at least first, second, third, and fourth spectral photoresponses;
wherein if M equals N at least two directions within each minimal repeating unit include individual filters having all the spectral photoresponses, the at least two directions being selected from a set of directions consisting of row, column, major diagonal and minor diagonal of the minimal repeating unit; and
wherein if M does not equal N at least two directions within each of one or more N×N or M×M cells within the minimal repeating unit include individual filters having all the spectral photoresponses, the at least two directions being selected from a set of directions consisting of row, column, major diagonal and minor diagonal of each N×N or M×M cells.

14. The image sensor of claim 13 wherein if M=N and all the photoresponses are found on the major diagonal or the minor diagonal, the resulting color filter array will have all the photoresponses in any diagonal that includes a number of individual filters that is equal to or greater than the number of spectral photoresponses.

15. The image sensor of claim 13 wherein if M≠N and all the photoresponses are found on the major diagonal or the minor diagonal within an N×N or M×M cell, the resulting color filter array will have all the photoresponses in any diagonal that includes a number of individual filters that is equal to or greater than the number of spectral photoresponses.

16. The image sensor of claim 13 wherein M=N=4 and the minimal repeating unit is:

| S3 | S4 | S2 | S1 |
|----|----|----|----|
| S2 | S1 | S3 | S4 |
| S4 | S3 | S1 | S2 |
| S1 | S2 | S4 | S3 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

17. The image sensor of claim 16 wherein:
the first, second, and third spectral photoresponses are selected from a group consisting of red (R), green (G), blue (B), cyan (C), magenta (M), and yellow (Y); and
the fourth spectral photoresponse is selected from a group consisting of panchromatic, infrared, ultraviolet, and x-ray.

18. The image sensor of claim 13 wherein M=N=4 and the minimal repeating unit is:

| | | | |
|---|---|---|---|
| S2 | S1 | S2 | S1 |
| S4 | S3 | S4 | S3 |
| S1 | S2 | S1 | S2 |
| S3 | S4 | S3 | S4 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

19. The image sensor of claim 13 wherein M=N=4 and the minimal repeating unit is:

| | | | |
|---|---|---|---|
| S2 | S4 | S1 | S3 |
| S1 | S3 | S2 | S4 |
| S2 | S4 | S1 | S3 |
| S1 | S3 | S2 | S4 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

20. The image sensor of claim 13 wherein M=N=5 and the minimal repeating unit is:

| | | | | |
|---|---|---|---|---|
| S3 | S2 | S2 | S1 | S4 |
| S2 | S1 | S4 | S3 | S2 |
| S4 | S3 | S2 | S2 | S1 |
| S2 | S2 | S1 | S4 | S3 |
| S1 | S4 | S3 | S2 | S2 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

21. The image sensor of claim 13 wherein M=N=5 and the minimal repeating unit is:

| | | | | |
|---|---|---|---|---|
| S1 | S2 | S3 | S4 | S5 |
| S3 | S4 | S5 | S1 | S2 |
| S5 | S1 | S2 | S3 | S4 |
| S2 | S3 | S4 | S5 | S1 |
| S4 | S5 | S1 | S2 | S3 | wherein S1 represents an individual filter with the first spectral photoresponse, S2 represents an individual filter with the second spectral photoresponse, S3 represents an individual filter with the third spectral photoresponse, S4 represents an individual filter with the fourth spectral photoresponse, and S5 represents an individual filter with a fifth spectral photoresponse.

22. The image sensor of claim 21 wherein:
the first, second, and third spectral photoresponses are selected from a group consisting of red (R), green (G), blue (B), cyan (C), magenta (M), and yellow (Y); and
the fourth and fifth spectral photoresponses are selected from a group consisting of panchromatic, infrared, ultraviolet, and x-ray.

23. The image sensor of claim 13 wherein M=4, N=8, and the minimal repeating unit is:

| | | | | | | | |
|---|---|---|---|---|---|---|---|
| S2 | S1 | S2 | S1 | S4 | S3 | S4 | S3 |
| S4 | S3 | S4 | S3 | S2 | S1 | S2 | S1 |
| S1 | S2 | S1 | S2 | S3 | S4 | S3 | S4 |
| S3 | S4 | S3 | S4 | S1 | S2 | S1 | S2 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

24. The image sensor of claim 13 wherein M=8, N=4, and the minimal repeating unit is:

| | | | |
|---|---|---|---|
| S2 | S4 | S1 | S3 |
| S1 | S3 | S2 | S4 |
| S2 | S4 | S1 | S3 |
| S1 | S3 | S2 | S4 |
| S4 | S2 | S3 | S1 |
| S3 | S1 | S4 | S2 |
| S4 | S2 | S3 | S1 |
| S3 | S1 | S4 | S2 | wherein S1 represents an individual filter with the first spectral photoresponse, S2 represents an individual filter with the second spectral photoresponse, S3 represents an individual filter with the third spectral photoresponse, and S4 represents an individual filter with the fourth spectral photoresponse.

* * * * *